(12) United States Patent
Chiang et al.

(10) Patent No.: US 8,054,934 B2
(45) Date of Patent: Nov. 8, 2011

(54) SHIFT REGISTER WITH NO OVERLAP EFFECTIVE OUTPUT SIGNAL AND LIQUID CRYSTAL DISPLAY USING THE SAME

(75) Inventors: Chien-Hsueh Chiang, Miao-Li (TW); Sz-Hsiao Chen, Miao-Li (TW)

(73) Assignee: Chimei Innolux Corporation, Miao-Li County (TW)

( * ) Notice: Subject to any disclaimer, the term of this patent is extended or adjusted under 35 U.S.C. 154(b) by 946 days.

(21) Appl. No.: 12/012,964

(22) Filed: Feb. 6, 2008

(65) Prior Publication Data

US 2008/0191994 A1 Aug. 14, 2008

(30) Foreign Application Priority Data

Feb. 9, 2007 (CN) .......................... 2007 1 0073261

(51) Int. Cl.
*G11C 19/00* (2006.01)
(52) U.S. Cl. ................. 377/64; 377/68; 377/78; 377/79
(58) Field of Classification Search .................... 377/64, 377/68, 69, 78, 79, 81
See application file for complete search history.

(56) References Cited

U.S. PATENT DOCUMENTS

| 5,222,082 A | 6/1993 | Plus |
| 5,410,583 A | 4/1995 | Weisbrod et al. |
| 2004/0017878 A1* | 1/2004 | Sun ................................. 377/64 |
| 2006/0210012 A1* | 9/2006 | Yamaguchi et al. ............ 377/64 |
| 2007/0195920 A1* | 8/2007 | Tobita ............................. 377/64 |
| 2011/0057926 A1* | 3/2011 | Shang ........................... 345/213 |

* cited by examiner

*Primary Examiner* — Tuan T Lam
(74) *Attorney, Agent, or Firm* — Altis Law Group, Inc.

(57) ABSTRACT

An exemplary shift register (20) includes a plurality of shift register units (200) connected one by one. Each of the shift register units includes a clock signal input terminal (TS), a high level signal input terminal (VH), a low level signal input terminal (VL), an output terminal (VOUT), a reverse output terminal (VOUTB), a first input terminal (VIN1), a second input terminal (VIN2), a first common node (P1), a second common node (P2), a first switch circuit (31), a second switch circuit (32), a third switch circuit (33), a fourth switch circuit (34), a fifth switch circuit (35), a six switch circuit (36), a first inverter (37) connected between the first common node and the second common node, and a second inverter (39) connected between the output terminal and the reverse output terminal.

18 Claims, 6 Drawing Sheets

SHIFT REGISTER WITH NO OVERLAP EFFECTIVE OUTPUT SIGNAL AND LIQUID CRYSTAL DISPLAY USING THE SAME

FIELD OF THE INVENTION

The present invention relates to shift registers, and particularly to a shift register with no overlap effective output signal and a liquid crystal display (LCD) employing the shift register.

GENERAL BACKGROUND

An LCD has the advantages of portability, low power consumption, and low radiation. Therefore, the LCD has been widely used in various portable information products, such as notebooks, personal digital assistant (PDA), video cameras, and the like.

In general, an LCD includes a gate driver and a data driver. The gate and data drivers drive thin film transistors (TFTs) of an LCD panel of the LCD to display images. Each of the gate and data drivers includes a shift register having a plurality of shift register units connected one by one. Each of the shift register units includes an input terminal and an output terminal. The input terminal of each shift register unit is connected to the output terminal of a pre-stage shift register unit. The output terminal of each shift register unit is connected to the input terminal of a rear-stage shift register unit.

Figure 5:
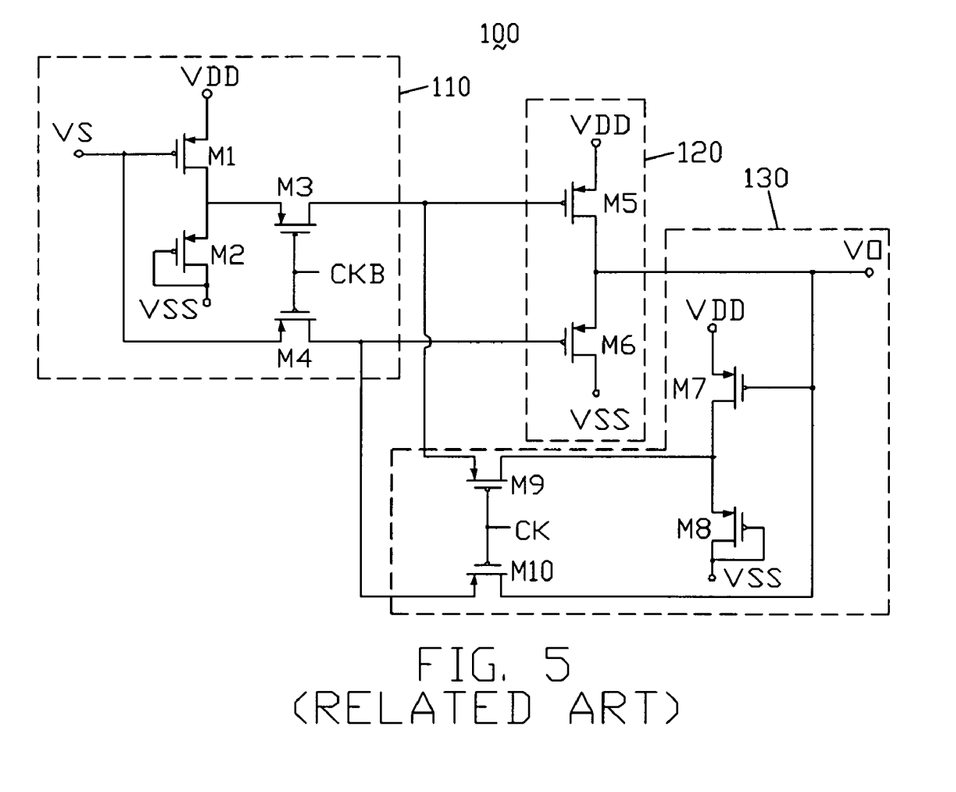
FIG. 5 is a circuit diagram of a shift register unit of a conventional shift register.

FIG. 5 is a circuit diagram of a shift register unit of a conventional shift register. The shift register unit 100 includes an input terminal (not labeled), a first clock reversed phase circuit 110, a switch circuit 120, a second clock reversed phase circuit 130, and an output terminal (not labeled).

The first clock reversed phase circuit 110 includes a first transistor M1, a second transistor M2, a third transistor M3, and a fourth transistor M4. The first to fourth transistors M1~M4 are P-channel metal-oxide-semiconductor (PMOS) transistors. A gate electrode of the first transistor M1 is the input terminal of the shift register unit 100 and is used to receive an input signal VS (i.e. an output signal of the output terminal of a pre-stage shift register unit). A source electrode of the first transistor M1 is used to receive a high level signal VDD. A drain electrode of the first transistor M1 is connected to a source electrode of the second transistor M2. A gate electrode and a drain electrode of the second transistor M2 are all used to receive a low level signal VSS. A gate electrode of the third transistor M3 and a gate electrode of the fourth transistor M4 are all used to receive a reverse clock signal CKB. A source electrode of the third transistor M3 is connected to the drain electrode of the first transistor M1. A source electrode of the fourth transistor M4 is connected to the gate electrode of the first transistor M1.

The switch circuit 120 includes a fifth transistor M5 and a sixth transistor M6. The fifth and sixth transistors M5, M6 are PMOS transistors. A gate electrode of the fifth transistor M5 is connected to a drain electrode of the third transistor M3. A source electrode of the fifth transistor M5 is used to receive the high level signal VDD. A drain electrode of the fifth transistor M5 is connected to a source electrode of the sixth transistor M6. A gate electrode of the sixth transistor M6 is connected to a drain electrode of the fourth transistor M4. A drain electrode of the sixth transistor M6 is used to receive the low level signal VSS. The source electrode of the sixth transistor M6 is the output terminal of the shift register unit 100 and is used to output an output signal VO.

The second clock reversed phase circuit 130 includes a seventh transistor M7, an eighth transistor M8, a ninth transistor M9, and a tenth transistor M10. The seventh to tenth transistors M7~M10 are PMOS transistors. A gate electrode of the seventh transistor M7 is connected to the output terminal. A source electrode of the seventh transistor M7 is used to receive the high level signal VDD. A drain electrode of the seventh transistor M7 is connected to a source electrode of the eighth transistor M8. A drain electrode and a gate electrode of the eighth transistor M8 are all used to receive the low level signal VSS. A source electrode of the ninth transistor M9 is connected to the drain electrode of the third transistor M3. A gate electrode of the ninth transistor M9 is used to receive a clock signal CK. A drain electrode of the ninth transistor M9 is connected to the drain electrode of the seventh transistor M7. A gate electrode of the tenth transistor M10 is used to receive the clock signal CK. A source electrode of the tenth transistor M10 is connected to the drain electrode of the fourth transistor M4. A drain electrode of the tenth transistor M10 is connected to the output terminal.

Figure 6:
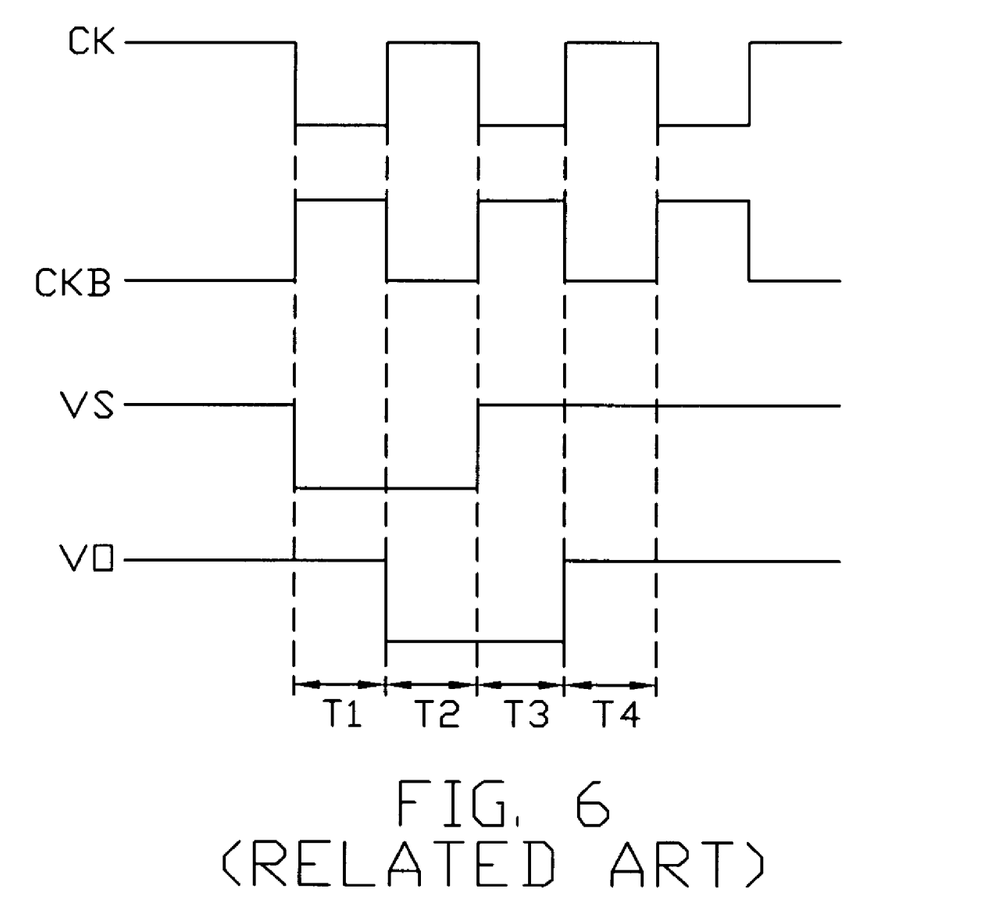
FIG. 6 is a sequence waveform diagram of pulse signals of the shift register of FIG. 5.

FIG. 6 is a sequence waveform diagram of pulse signals of the shift register unit of FIG. 5. During a first period T1, the reverse clock signal CKB is a high level, thus the third transistor M3 and the fourth transistor M4 are turned off. The clock signal CK is a low level, thus the ninth transistor M9 and the tenth transistor M10 are turned on. The output signal VO is a high level, thus the output signal VO turns off the sixth transistor M6 via the actived tenth transistor M10. The gate electrode of the eighth transistor M8 receives the low level signal VSS, thus the eighth transistor M8 is turned on. The low level signal VSS turns on the fifth transistor M5 via the actived eighth transistor M8 and the actived ninth transistor M9. The output terminal of the shift register unit 100 receives the high level signal VDD via the actived fifth transistor M5. That is, the output signal VO is high level during the first period T1.

During a second period T2, the reversed clock signal CKB is a low level, thus the third transistor M3 and the fourth transistor M4 are turned on. The clock signal CK is a high level, thus the ninth transistor M9 and the tenth transistor M10 are turned off. The input signal VS is a low level, thus the first transistor M1 is turned on. The high level signal VDD turns off the fifth transistor M5 via the actived first transistor M1 and the actived third transistor M3. The input signal VS turns on the sixth transistor M6 via the actived fourth transistor M4. The output terminal of the shift register unit 100 receives the low level signal VSS via the actived sixth transistor M6. That is, the output signal VO is low level during the second period T2.

During a third period T3, the reversed clock signal CKB is a high level, thus the third transistor M3 and the fourth transistor M4 are turned off. The clock signal CK is a low level, thus the ninth transistor M9 and the tenth transistor M10 are turned on. The output signal VO is a low level, thus the output signal VO turns on the seventh transistor M7 and the sixth transistor M6 via the actived tenth transistor M10. The high level signal VDD turns off the fifth transistor M5 via the actived seventh transistor M7 and the actived ninth transistor M9. The output terminal of the shift register unit 100 receives the low level signal VSS via the actived sixth transistor M6. That is, the output signal VO is low level during the third period T3.

During a fourth period T4, the reversed clock signal CKB is a low level, thus the third transistor M3 and the fourth transistor M4 are turned on. The clock signal CK is a high level, thus the ninth transistor M9 and the tenth transistor M10 are turned off. The input signal VS is high level, thus the first transistor M1 is turned off. The input signal VS turns off the sixth transistor M6 via the actived fourth transistor M4. The gate electrode of the second transistor M2 receives the low level signal VSS, thus the second transistor M2 is turned on. The low level signal VSS turns on the fifth transistor M5 via the actived second transistor M2 and the actived third transistor M3. The output terminal of the shift register unit 100 receives the high level signal VDD via the actived fifth transistor M5. That is, the output signal VO is high level during the fourth period T4.

The pre-stage shift register unit of the shift register unit 100 outputs low level signal during the first period T1 and the second period T2, and the shift register unit 100 outputs low level signal during the second period T2 and the third period T3. That is, the low level signal outputted by the pre-stage shift register unit overlaps with the low level signal outputted by the shift register unit 100 during the second period T2. The low level signal is an effective signal of the shift register. Thus, the effective signals outputted by the shift register units of the shift register are partly overlapped with each other.

When the gate driver of the LCD employs the shift register to realize one row scanning or one column scanning, it is liable to scan two rows or two columns in the same time. Thus, the signals processed by the gate driver may be interfered with each other. The source driver of the LCD has the similar problem when the source driver employs the shift register.

What is needed, therefore, is a shift register and an LCD employing the shift register that can overcome the above-described deficiencies.

SUMMARY

A shift register includes a plurality of shift register units. Each of the shift register units includes: a first switch circuit controlled by a first input terminal of the shift register unit and a second common node of the shift register unit and configured for providing a high level signal to a first common node of the shift register unit; a second switch circuit controlled by the first input terminal and a second input terminal of the shift register unit and configured for providing a high level signal to the first common node; a third switch circuit controlled by the first input terminal and configured for providing a low level signal to the first common node; a fourth switch circuit controlled by the second input terminal and the second common node and configured for providing a low level signal to the first common node; a fifth switch circuit controlled by the first common node and the second common node and configured for providing a clock signal to an output terminal of the shift register unit; a sixth switch circuit controlled by the first common node and configured for providing a low level signal to the output terminal; a first inverter connected between the first common node and the second common node; and a second inverter connected between the output terminal and a reverse output terminal of the shift register unit.

A shift register includes a plurality of shift register units connected one by one. Each of the shift register units includes a clock signal input terminal configured for receiving a clock signal, a high level signal input terminal configured for receiving a high level signal, a low level signal input terminal configured for receiving a low level signal, a first input terminal configured for receiving a first input signal, a second input terminal configured for receiving a second input signal, an output terminal configured for outputting an output signal, and a reverse output terminal configured for outputting a reverse output signal. The output signal is low level when the clock signal is low level, the first input signal is high level, and the second input signal is high level. The output signal is low level when the clock signal is low level, the first input signal is low level, and the second input signal is low level. The output signal is low level when the clock signal is high level, the first input signal is low level, and the second input signal is high level. The output signal is high level when the clock signal is high level, the first input signal is low level, and the second input signal is high level.

A liquid crystal display includes a liquid crystal panel and a driver circuit configured for driving the liquid crystal panel. The driver circuit includes a shift register. The shift register includes a plurality of shift register units. Each of the shift register units includes: a first switch circuit controlled by a first input terminal of the shift register unit and a second common node of the shift register unit and configured for providing a high level signal to a first common node of the shift register unit; a second switch circuit controlled by the first input terminal and a second input terminal of the shift register unit and configured for providing a high level signal to the first common node; a third switch circuit controlled by the first input terminal and configured for providing a low level signal to the first common node; a fourth switch circuit controlled by the second input terminal and the second common node and configured for providing a low level signal to the first common node; a fifth switch circuit controlled by the first common node and the second common node and configured for providing a clock signal to an output terminal of the shift register unit; a sixth switch circuit controlled by the first common node and configured for providing a low level signal to the output terminal; a first inverter is connected between the first common node and the second common node; and a second inverter is connected between the output terminal and a reverse output terminal of the shift register unit.

Other novel features and advantages will become more apparent from the following detailed description when taken in conjunction with the accompanying drawings.

DETAILED DESCRIPTION OF PREFERRED EMBODIMENTS

Reference will now be made to the drawings to describe the preferred and exemplary embodiments in detail.

Figure 1:
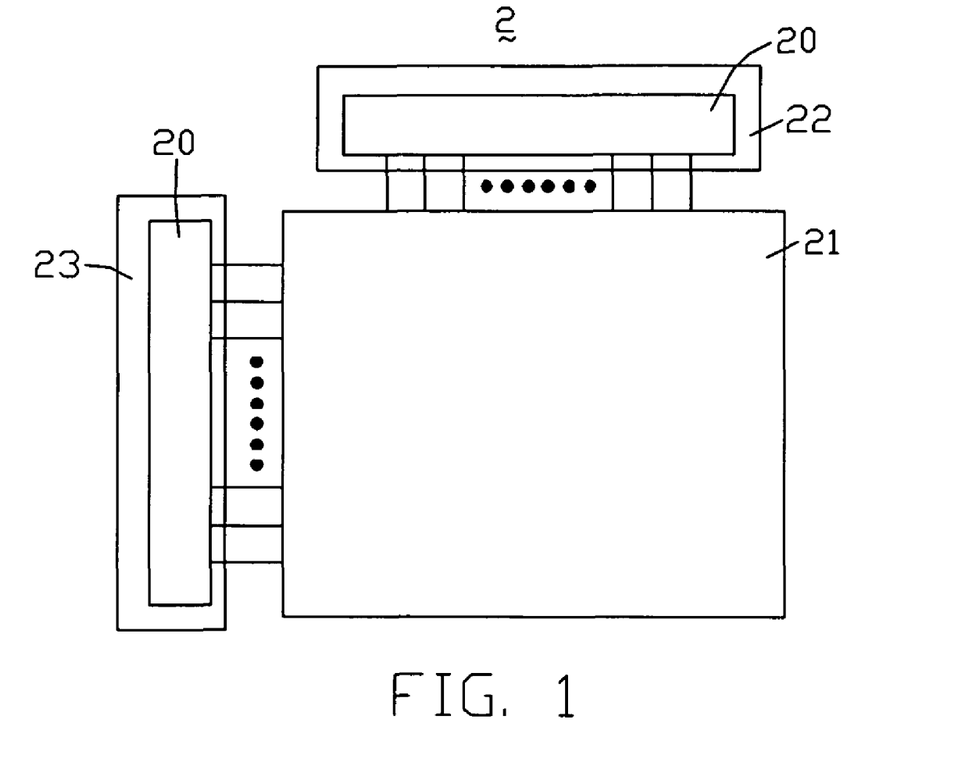
FIG. 1 is a schematic, abbreviated diagram of certain components of an LCD according to an exemplary embodiment of the present invention, the LCD including a shift register.

FIG. 1 is a schematic, abbreviated diagram of certain components of an LCD according to an exemplary embodiment of the present invention. The LCD 2 includes a liquid crystal panel 21, a source driver 22 connected to the liquid crystal panel 21 via a plurality of data lines (not labeled), and a gate driver 23 connected to the liquid crystal panel 21 via a plurality of gate lines (not labeled). The liquid crystal panel 21 includes a plurality of thin film transistors (TFTs). Each of the data and gate drivers 22, 23 includes a shift register 20. The shift register 20 provides shift signals to the data driver 22 or the gate driver 23. The gate driver 23 outputs high level signals or low level signals to turn on or turn off the TFTs. The data driver 23 outputs data signals to the liquid crystal panel 21 via the actived TFTs to display images.

Figure 2:
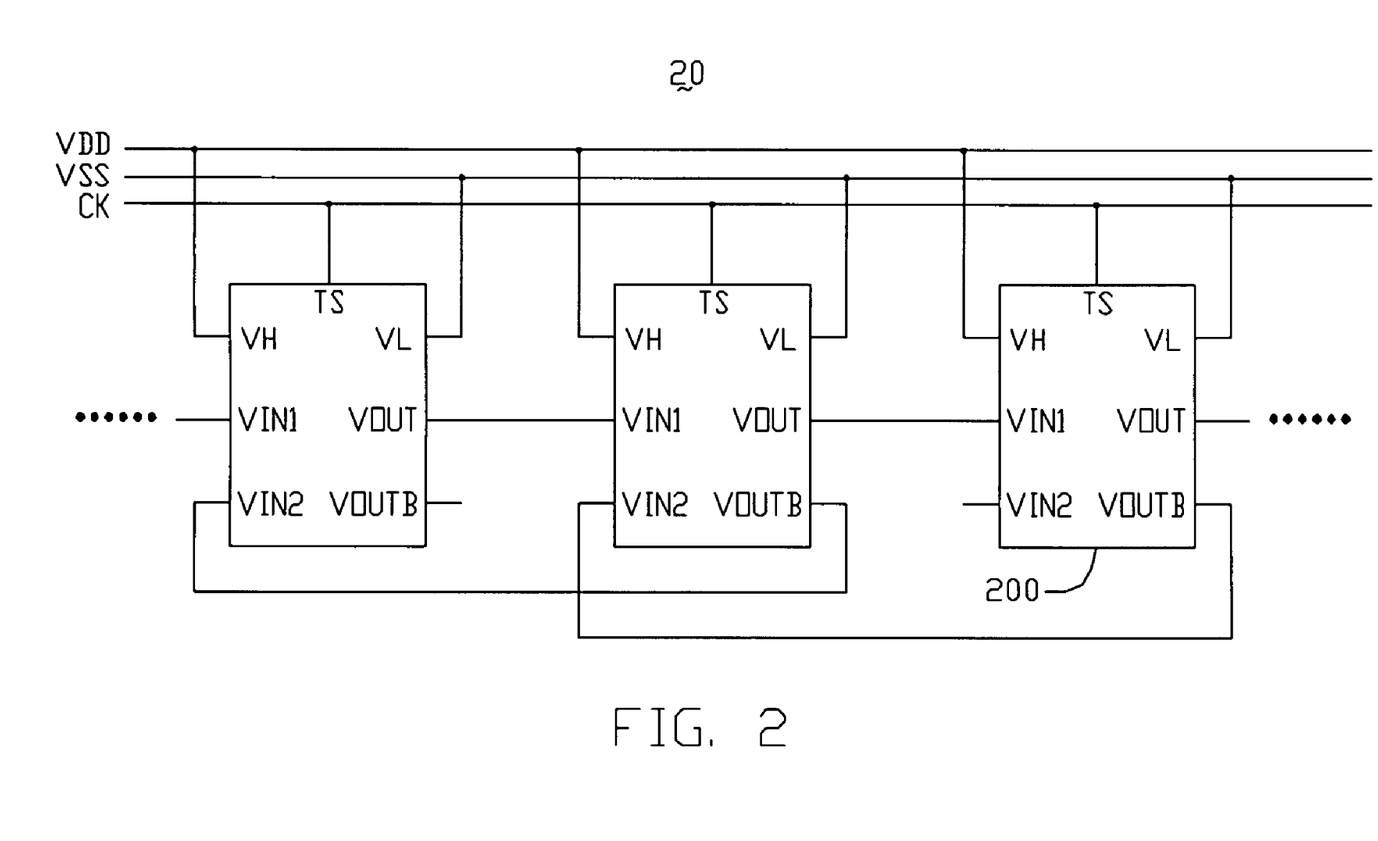
FIG. 2 is an abbreviated block circuit diagram of the shift register of FIG. 1, the shift register including a plurality of shift register units connected one by one.

FIG. 2 is an abbreviated block circuit diagram of the shift register 20 of FIG. 1. The shift register 20 includes a plurality of shift register units 200 connected one by one. All of the shift register units 200 have similar structures. Each of the shift register units 200 includes a clock signal input terminal TS for receiving a clock signal CK, a high level signal input terminal VH for receiving a high level signal VDD, a low level signal input terminal VL for receiving a low level signal VSS, a first input terminal VIN1, a second input terminal VIN2, an output terminal VOUT, and a reverse output terminal VOUTB. The first input terminal VIN1 of each shift register unit 200 is connected to the output terminal of a pre-stage shift register unit. The second input terminal VIN2 of each shift register unit 200 is connected to the reverse output terminal VOUTB of a rear-stage shift register unit. The output terminal VOUT of each shift register unit 200 is connected to the first input terminal VIN1 of the rear-stage shift register unit. The reverse output terminal VOUTB of each shift register unit 200 is connected to the second input terminal VIN2 of the pre-stage shift register unit.

Figure 3:
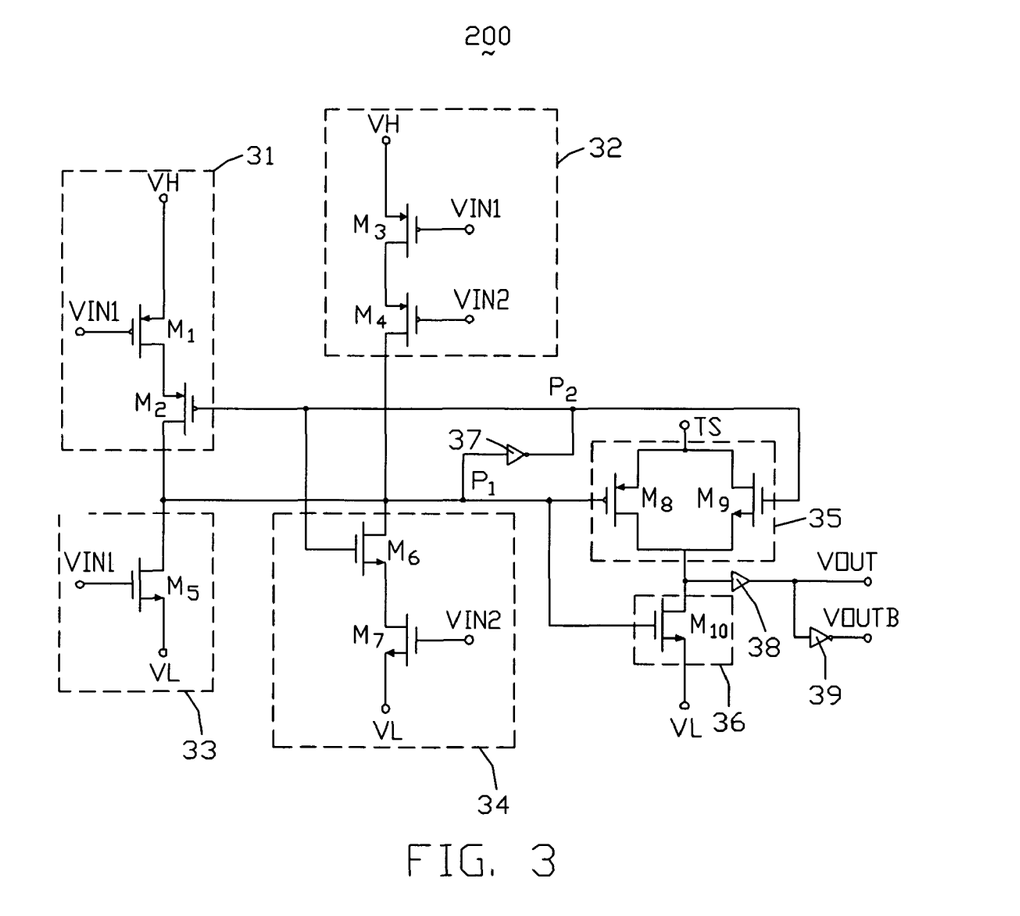
FIG. 3 is a circuit diagram of one of the shift register units of FIG. 2.

FIG. 3 is a circuit diagram of one of the shift register units 200 of FIG. 2. The shift register unit 200 includes a first switch circuit 31, a second switch circuit 32, a third switch circuit 33, a fourth switch circuit 34, a fifth switch circuit 35, a six switch circuit 36, a first inverter 37, a buffer 38, a second inverter 39, a first common node P1, and a second common node P2.

The first switch circuit 31 includes a first transistor M1 and a second transistor M2. The first transistor M1 and the second transistor M2 are P-channel metal-oxide-semiconductor (PMOS) transistors. A gate electrode of the first transistor M1 is connected to the first input terminal VIN1. A source electrode of the first transistor M1 is connected to the high level signal input terminal VH. A drain electrode of the first transistor M1 is connected to a source electrode of the second transistor M2. A gate electrode of the second transistor M2 is connected to the second common node P2. A drain electrode of the second transistor M2 is connected to the first common node P1.

The second switch circuit 32 includes a third transistor M3 and a fourth transistor M4. The third transistor M3 and the fourth transistor M4 are PMOS transistors. A gate electrode of the third transistor M3 is connected to the first input terminal VIN1. A source electrode of the third transistor M3 is connected to the high level signal input terminal VH. A drain electrode of the third transistor M3 is connected to a source electrode of the fourth transistor M4. A gate electrode of the fourth transistor M4 is connected to the second input terminal VIN2. A drain electrode of the fourth transistor M4 is connected to the first common node P1.

The third switch circuit 33 can be a fifth transistor M5. The fifth transistor M5 is an N-channel metal-oxide-semiconductor (NMOS) transistor. A gate electrode of the fifth transistor M5 is connected to the first input terminal VIN1. A source electrode of the fifth transistor M5 is connected to the low level signal input terminal VL. A drain electrode of the fifth transistor M5 is connected to the first common node P1.

The fourth switch circuit 34 includes a sixth transistor M6 and a seventh transistor M7. The sixth transistor M6 and the seventh transistors M7 are NMOS transistors. A gate electrode of the sixth transistor M6 is connected to the second common node P2. A source electrode of the sixth transistor M6 is connected to a drain electrode of the seventh transistor M7. A drain electrode of the sixth transistor M6 is connected to the first common node P1. A gate electrode of the seventh transistor M7 is connected to the second input terminal VIN2. A source electrode of the seventh transistor M7 is connected to the low level signal input terminal VL.

The fifth switch circuit 35 includes an eighth transistor M8 and a ninth transistor M9. The eighth transistor M8 is a PMOS transistor, and the ninth transistor M9 is an NMOS transistor. A gate electrode of the eighth transistor M8 is connected to the first common node P1. A source electrode of the eighth transistor M8 is connected to the clock signal input terminal TS. A drain electrode of the eighth transistor M8 is connected to the buffer 38. A gate electrode of the ninth transistor M9 is connected to the second common node P2. A drain electrode of the ninth transistor M9 is connected to the clock signal input terminal TS. A source electrode of the ninth transistor M9 is connected to the buffer 38.

The sixth switch circuit 36 can be a tenth transistor M10. The tenth transistor M10 is an NMOS transistor. A gate electrode of the tenth transistor M10 is connected to the first common node P1. A source electrode of the tenth transistor M10 is connected to the low level signal input terminal VL. A drain electrode of the tenth transistor M10 is connected to the buffer 38.

The first common node P1 is connected to the second common node P2 via the first inverter 37. The output terminal VOUT is connected to the buffer 38. The reverse output terminal VOUTB is connected to the output terminal VOUT via the second inverter 39.

The buffer 38 includes two inverters (not shown) connected in series. The buffer 38 is configured for reducing distortion of the output waveform of the shift register unit 200.

Figure 4:
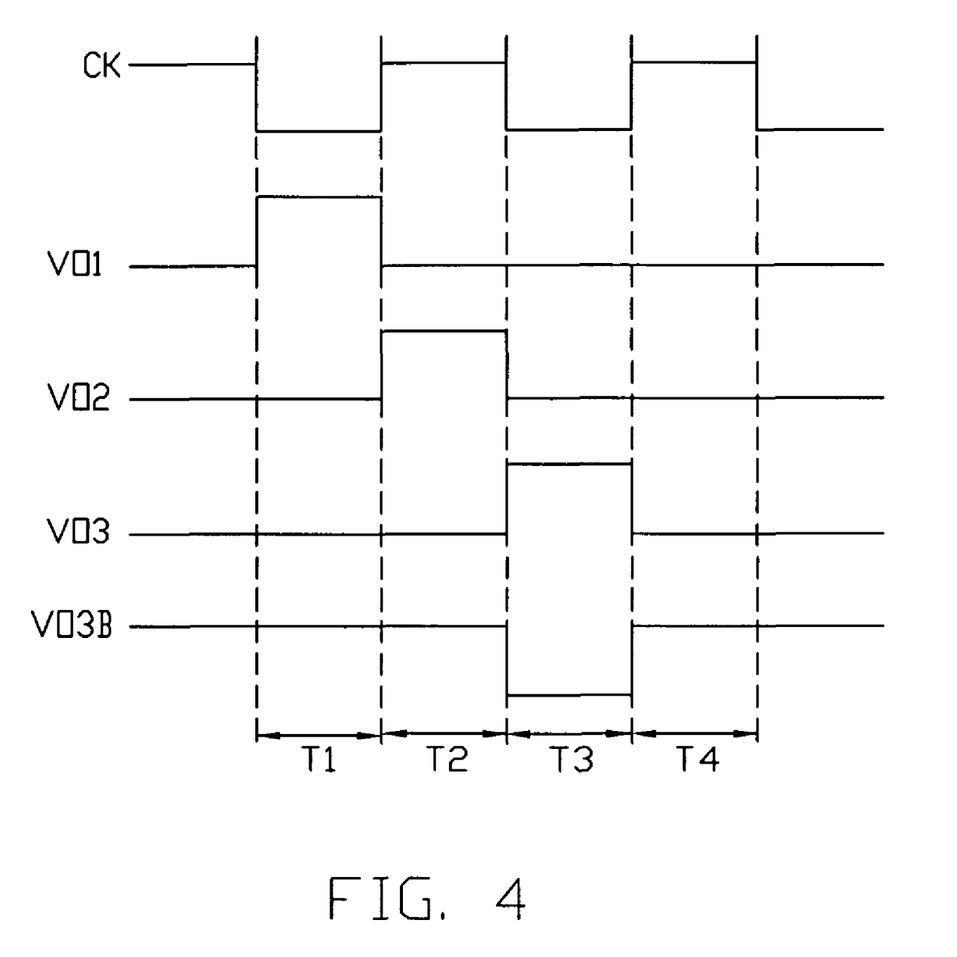
FIG. 4 is a sequence waveform diagram of pulse signals of the shift register of FIG. 2.

FIG. 4 is a sequence waveform diagram of pulse signals of the shift register 20 of FIG. 2. VO2 represents an output signal of the output terminal VOUT of any shift register unit. VO1 represents an output signal of the output terminal VOUT of a pre-stage shift register unit. VO3 and VO3B respectively represent an output signal of the output terminal VOUT and a reverse output signal of the reverse output terminal VOUTB of a rear-stage shift register unit.

During a first period T1, the output signal VO1 is a high level, thus the first transistor M1 is turned off, the third transistor M3 is turned off, the fifth transistor M5 is turned on. The first common node P1 is pulled in a low level state via the actived fifth transistor M5. The eighth transistor M8 is turned on, and the tenth transistor M10 is turned off. The second common node P2 is in a high level state. The second transistor M2 is turned off, the sixth transistor M6 is turned on, and the ninth transistor M9 is turned on. The reverse output signal VO3B is a high level, thus the fourth transistor M4 is turned off, and the seventh transistor M7 is turned on. Because the third switch circuit 33 and the fourth switch circuit 34 are in actived states, the first common node P1 keeps in the low level state during the whole first period T1. The second common node P2 correspondingly keeps in the high level state during the whole first period T1. The buffer 38 receives the clock signal CK via the actived eighth transistor M8, the buffer 38 also receives the clock signal CK via the actived ninth transistor M9. The clock signal CK is low level during the first period T1, Thus, the output signal VO2 is low level.

During a second period T2, the output signal VO1 is a low level, thus the first transistor M1 is turned on, the third transistor M3 is turned on, the fifth transistor M5 is turned off. Because the second common node P2 is in the high level state, the second transistor M2 is turned off, the sixth transistor M6 is turned on, and the ninth transistor M9 is turned on. The reverse output signal VO3B is a high level, thus the fourth transistor M4 is turned off, and the seventh transistor M7 is turned on. Because the fourth switch circuit 34 is in an actived state, the first common node P1 still keeps in the low level state during the whole second period T2. The eighth transistor M8 is turned on, and the tenth transistor M10 is turned off. The second common node P2 correspondingly keeps in the high level state during the whole second period T2. The buffer 38 receives the clock signal CK via the actived eighth transistor M8, and the buffer 38 also receives the clock signal CK via the actived ninth transistor M9. The clock signal CK is high level during the second period T2, Thus, the output signal VO2 is high level.

During a third period T3, the output signal VO1 is a low level, thus the first transistor M1 is turned on, the third transistor M3 is turned on, the fifth transistor M5 is turned off. The reverse output signal VO3B is a low level, thus the fourth transistor M4 is turned on, and the seventh transistor M7 is turned off. The first common node P1 is pulled in a high level state via the actived third transistor M3 and the actived transistor M4. The eighth transistor M8 is turned off, and the tenth transistor M10 is turned on. The second common node P2 is in a low level state. The second transistor M2 is turned on, the sixth transistor M6 is turned off, and the ninth transistor M9 is turned off. The buffer 38 receives the low level signal VSS via the actived tenth transistor M10, Thus, the output signal VO2 is low level.

During a third period T4, the output signal VO1 is a low level, thus the first transistor M1 is turned on, the third transistor M3 is turned on, the fifth transistor M5 is turned off. Because the second common node P2 is still in the low level state, the second transistor M2 is turned on, the sixth transistor M6 is turned off, and the ninth transistor M9 is turned off. The first common node P1 is pulled in a high level state via the actived first transistor M1 and the actived second transistor M2. The eighth transistor M8 is turned off, and the tenth transistor M10 is turned on. The reverse output signal VO3B is a high level, thus the fourth transistor M4 is turned off, and the seventh transistor M7 is turned on. The second common node P2 correspondingly keeps in the low level state during the whole fourth period T4. The buffer 38 receives the low level signal VSS via the actived tenth transistor M10, Thus, the output signal VO2 is low level.

The pre-stage shift register unit of the shift register unit 100 merely outputs high level signal during the first period T1, the shift register unit 100 merely outputs high level signal during the second period T2, the rear-stage shift register unit of the shift register unit 100 merely outputs high level signal during the third period T3. The high level signal is an effective signal of the shift register 20. Thus, the effective signals outputted by the shift register units of the shift register 20 are not overlapped with each other.

Moreover, when the output signal VO2 is the clock signal CK, the clock signal CK is respectively transmitted to the output terminal VOUT via the actived eighth transistor M8 and the actived ninth transistor M9. Thus, the shift register 20 can tolerate longer clock signal rising time or clock signal falling time. The output signal VO2 is correspondingly more accurate. The shift register 20 also can receive a higher high level signal or a lower low level signal.

Furthermore, because the effective signals outputted by the shift register units 200 of the shift register 20 are not overlapped with each other, when the gate driver 23 or the data driver 22 of the LCD 2 employs the shift register 20, the signals processed by the gate driver 23 or the data driver 22 are not interfered with each other when the gate driver 23 or the data driver 22 of the LCD 2 employs the shift register 20.

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shift register, comprising a plurality of shift register units, each shift register unit comprising:
    a first switch circuit controlled by a first input terminal of the shift register unit and a second common node of the shift register unit and configured for providing a high level signal to a first common node of the shift register unit;
    a second switch circuit controlled by the first input terminal and a second input terminal of the shift register unit and configured for providing a high level signal to the first common node;
    a third switch circuit controlled by the first input terminal and configured for providing a low level signal to the first common node;
    a fourth switch circuit controlled by the second input terminal and the second common node and configured for providing a low level signal to the first common node;
    a fifth switch circuit controlled by the first common node and the second common node and configured for providing a clock signal to an output terminal of the shift register unit;
    a sixth switch circuit controlled by the first common node and configured for providing a low level signal to the output terminal;
    a first inverter connected between the first common node and the second common node; and
    a second inverter connected between the output terminal and a reverse output terminal of the shift register unit.

2. The shift register as claimed in claim 1, further comprising a clock signal input terminal configured for receiving the clock signal, a high level signal input terminal configured for receiving the high level signal, and a low level signal input terminal configured for receiving the low level signal.

3. The shift register as claimed in claim 2, wherein the first switch circuit comprises a first transistor and a second transistor, a gate electrode of the first transistor is connected to the first input terminal, a source electrode of the first transistor is connected to the high level signal input terminal, a drain electrode of the first transistor is connected to a source electrode of the second transistor, a gate electrode of the second transistor is connected to the second common node, a drain electrode of the second transistor is connected to the first common node.

4. The shift register as claimed in claim 3, wherein the first transistor and the second transistor are P-channel metal-oxide-semiconductor transistors.

5. The shift register as claimed in claim 2, wherein the second switch circuit comprises a first transistor and a second transistor, a gate electrode of the first transistor is connected to the first input terminal, a source electrode of the first transistor is connected to the high level signal input terminal, a drain electrode of the first transistor is connected to a source electrode of the second transistor, a gate electrode of the second transistor is connected to the second input terminal, a drain electrode of the second transistor is connected to the first common node.

6. The shift register as claimed in claim 5, wherein the first transistor and the second transistor are P-channel metal-oxide-semiconductor transistors.

7. The shift register as claimed in claim 2, wherein the third switch circuit is a transistor, a gate electrode of the transistor is connected to the first input terminal, a source electrode of the transistor is connected to the low level signal input terminal, a drain electrode of the transistor is connected to the first common node.

8. The shift register as claimed in claim 7, wherein the transistor is an N-channel metal-oxide-semiconductor transistor.

9. The shift register as claimed in claim 2, wherein the fourth switch circuit comprises a first transistor and a second transistor, a gate electrode of the first transistor is connected to the second common node, a source electrode of the first transistor is connected to a drain electrode of the second transistor, a drain electrode of the first transistor is connected to the first common node, a gate electrode of the second transistor is connected to the second input terminal, a source electrode of the second transistor is connected to the low level signal input terminal.

10. The shift register as claimed in claim 9, wherein the first transistor and the second transistor are N-channel metal-oxide-semiconductor transistors.

11. The shift register as claimed in claim 2, wherein the fifth switch circuit comprises a first transistor and a second transistor, a gate electrode of the first transistor is connected to the first common node, a source electrode of the first transistor is connected to the clock signal input terminal, a drain electrode of the first transistor is connected to the output terminal, a gate electrode of the second transistor is connected to the second common node, a drain electrode of the second transistor is connected to the clock signal input terminal, a source electrode of the second transistor is connected to the output terminal.

12. The shift register as claimed in claim 11, wherein the first transistor is a P-channel metal-oxide-semiconductor transistor, and the second transistor is an N-channel metal-oxide-semiconductor transistor.

13. The shift register as claimed in claim 2, wherein the sixth switch circuit is a transistor, a gate electrode of the transistor is connected to the first common node, a source electrode of the transistor is connected to the low level signal input terminal, a drain electrode of the transistor is connected to the output terminal.

14. The shift register as claimed in claim 13, wherein the transistor is an N-channel metal-oxide-semiconductor transistor.

15. The shift register as claimed in claim 2, further comprising a buffer connected between the fifth switch circuit and the output terminal.

16. The shift register as claimed in claim 15, wherein the buffer comprises two inverters connected in series.

17. A shift register, comprising a plurality of shift register units connected one by one, each of the shift register units comprising a clock signal input terminal configured for receiving a clock signal, a high level signal input terminal configured for receiving a high level signal, a low level signal input terminal configured for receiving a low level signal, a first input terminal configured for receiving a first input signal, a second input terminal configured for receiving a second input signal, an output terminal configured for outputting an output signal, and a reverse output terminal configured for outputting a reverse output signal;
    wherein the output signal is low level when the clock signal is low level, the first input signal is high level, and the second input signal is high level;
    the output signal is low level when the clock signal is low level, the first input signal is low level, and the second input signal is low level;
    the output signal is low level when the clock signal is high level, the first input signal is low level, and the second input signal is high level; and
    the output signal is high level when the clock signal is high level, the first input signal is low level, and the second input signal is high level.

18. A liquid crystal display, comprising a liquid crystal panel and a driver circuit configured for driving the liquid crystal panel; the driver circuit comprising a shift register; the shift register comprising a plurality of shift register units, each shift register unit comprising:
    a first switch circuit controlled by a first input terminal of the shift register unit and a second common node of the shift register unit and configured for providing a high level signal to a first common node of the shift register unit;
    a second switch circuit controlled by the first input terminal and a second input terminal of the shift register unit and configured for providing a high level signal to the first common node;
    a third switch circuit controlled by the first input terminal and configured for providing a low level signal to the first common node;
    a fourth switch circuit controlled by the second input terminal and the second common node and configured for providing a low level signal to the first common node;
    a fifth switch circuit controlled by the first common node and the second common node and configured for providing a clock signal to an output terminal of the shift register unit;
    a sixth switch circuit controlled by the first common node and configured for providing a low level signal to the output terminal;
    a first inverter connected between the first common node and the second common node; and
    a second inverter connected between the output terminal and a reverse output terminal of the shift register unit.

* * * * *